United States Patent [19]
Chou

[11] Patent Number: 6,087,594
[45] Date of Patent: Jul. 11, 2000

[54] POWER CABLE BINDER MOUNTING ARRANGEMENT FOR A POWER SUPPLY DEVICE

[76] Inventor: Tsai Li Hui Chou, 3F., No. 11, Ming Shiao Rd., San Ming Chu, Kao Hsiung City, Taiwan

[21] Appl. No.: 09/137,300

[22] Filed: Aug. 21, 1998

[51] Int. Cl.[7] .................................................. H02G 3/08
[52] U.S. Cl. ...................... 174/135; 174/72 A; 439/501
[58] Field of Search ............................. 174/135, 72 A, 174/70 R, 71 R, 72 R; 361/826, 827, 828; 439/501, 372, 449, 472

[56] References Cited

U.S. PATENT DOCUMENTS

| | | |
|---|---|---|
| 4,182,005 | 1/1980 | Harrington ..................... 439/501 X |
| 4,289,288 | 9/1981 | Gransberry et al. ................ 439/501 X |
| 4,289,366 | 9/1981 | Marks .................................. 439/501 X |
| 5,668,351 | 9/1997 | Hanlon et al. ..................... 174/72 A X |
| 5,697,809 | 12/1997 | Chung ..................................... 439/501 |
| 5,940,962 | 8/1999 | Shima et al. ...................... 174/70 R X |

*Primary Examiner*—Dean A. Reichard
*Attorney, Agent, or Firm*—Bacon & Thomas, PLLC

[57] ABSTRACT

A power cable binder mounting arrangement includes a casing having a transverse sliding track extended to one vertical side wall thereof near the top, a raised portion in the transverse sliding track, and a bottom hook, and a slotted power cable binder moved in and out of the transverse sliding track and secured in the desired position by the raised portion in the sliding track and fastened to the bottom hook with an end hook thereof to secure the power cable of the power supply device in an arranged condition.

2 Claims, 4 Drawing Sheets

POWER CABLE BINDER MOUNTING ARRANGEMENT FOR A POWER SUPPLY DEVICE

BACKGROUND OF THE INVENTION

The present invention relates to a power cable binder mounting arrangement for a power supply device in which the power cable binder can be set between a first position received inside the casing of the power supply device, and a second position to hold the power cable of the power supply device in an arranged condition.

A power supply device has a power cable extended from transverse side thereof for connection to a power supply outlet. When receiving the power supply device, the user may wind the power cable round the casing of the power supply device. When winding the power cable round the casing of the power supply device, the conductors in the power cable may easily be broken.

SUMMARY OF THE INVENTION

It is one object of the present invention to provide a power cable binder which can conveniently be installed in a power supply device to secure the power cable of the power supply device to one vertical side wall of the power supply device in an arranged condition. It is another object of the present invention to provide a power cable binder which can conveniently received inside the power supply device and firmly retained in the received position when not in use. According to the present invention, the power cable binder mounting arrangement comprises a casing having a transverse sliding track extended to one vertical side wall thereof near the top, a raised portion in the transverse sliding track, and a bottom hook, and a power cable binder moved in and out of the transverse sliding track and secured in the desired position by the raised portion in the sliding track and fastened to the bottom hook with an end hook thereof to secure the power cable of the power supply device in an arranged condition. The power cable binder has a longitudinal series of positioning holes for engagement with the raised portion in the transverse sliding track inside the casing.

DETAILED DESCRIPTION OF THE PREFERRED EMBODIMENT

Figure 1:
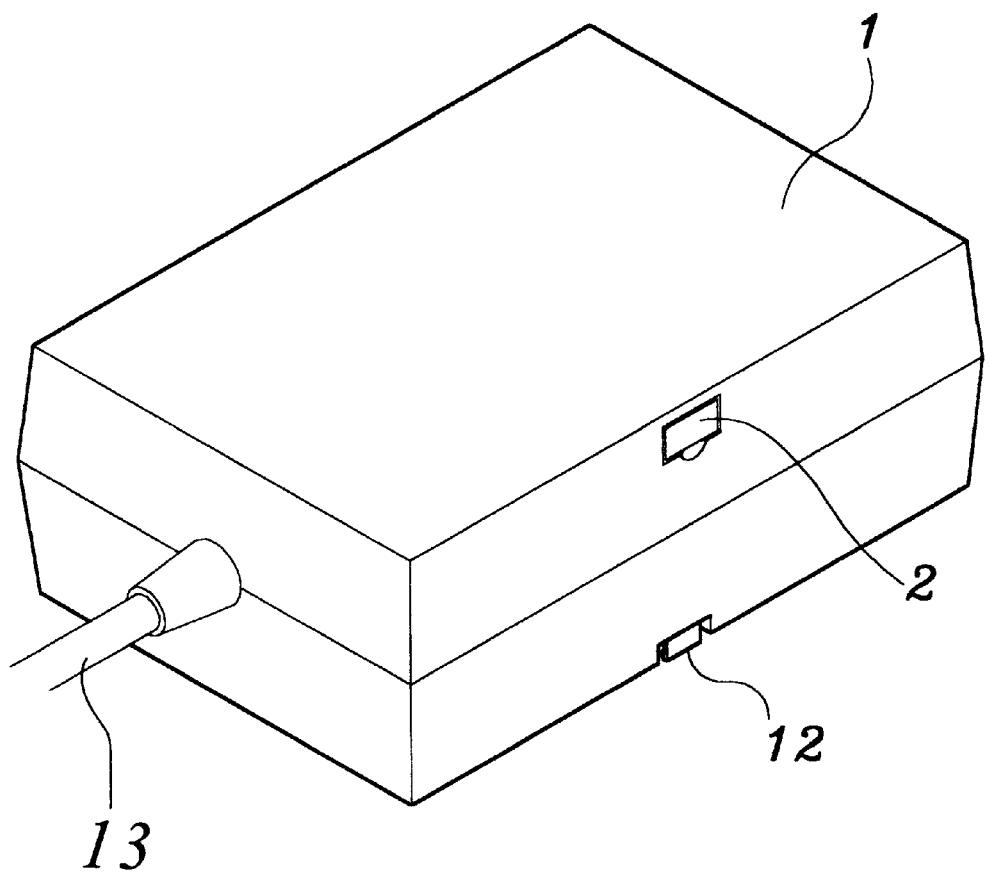
FIG. 1 is a perspective view of the present invention, showing the power cable binder received inside the casing.
Figure 2:
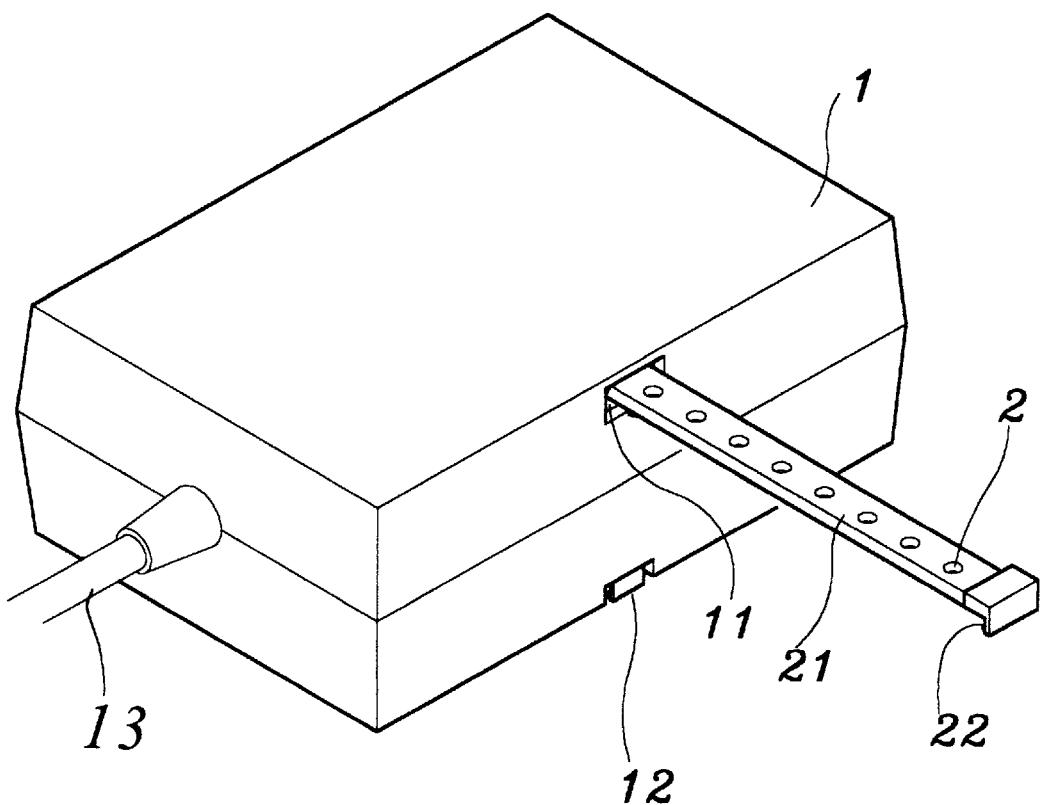
FIG. 2 is another perspective view of the present invention, showing the power cable binder pulled out of the transverse sliding track of the casing.

Referring to FIGS. 1 and 2, the casing 1 for a power supply device comprises a transverse track 11 transversely extended to one vertical side wall thereof near the top, at least one for example one raised portion 111 provided in the transverse sliding track 11, and a bottom hook 12 raised from a recessed portion at the bottom side wall thereof. A power cable binder 2 is provided having a rear end inserted into the transverse sliding track 11 and a front end terminating in an end hook 22 for hooking up with the bottom hook 12 at the casing 1. The power cable binder 2 is a flexible strip having a longitudinal series of positioning holes 21 for engagement with the raised portion 111.

Figure 3:
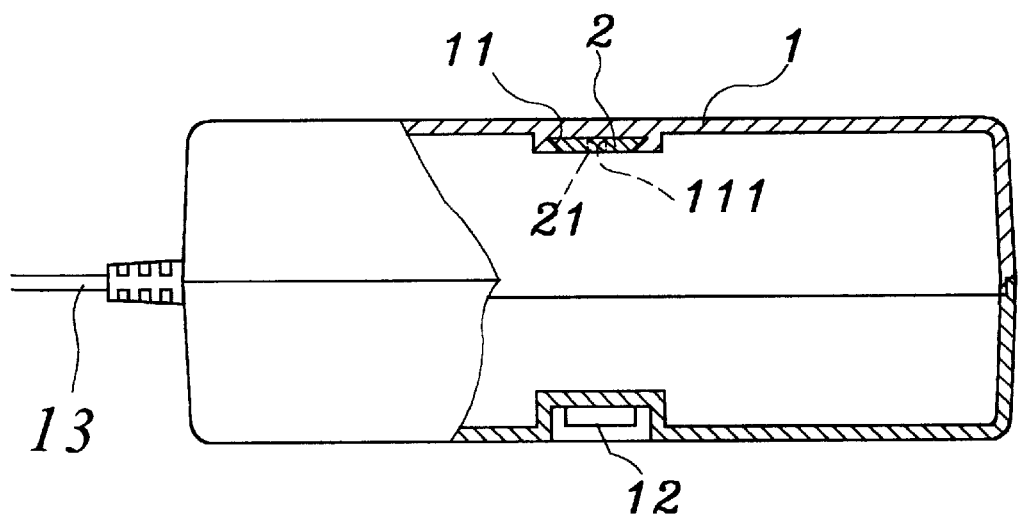
FIG. 3 is a longitudinal view in section of FIG. 1.
Figure 4:
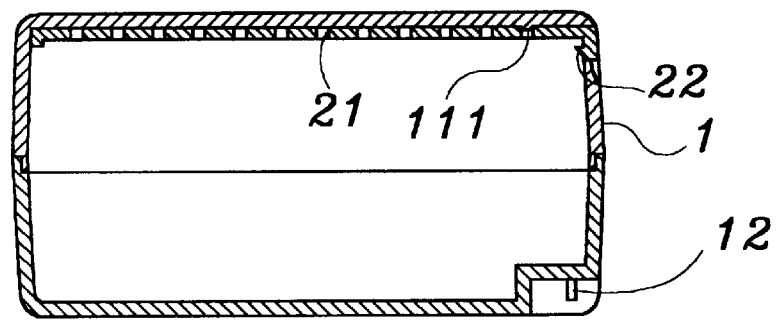
FIG. 4 is a transverse view in section of FIG. 1.

Referring to FIGS. 3 and 4, when the power cable 13 of the power supply device is connected to a power supply outlet, the power cable binder 2 is completely inserted into the transverse sliding track 11 with the end hook 22 stopped outside the casing 1, and retained in the received position by the raised portion 111.

Figure 5:
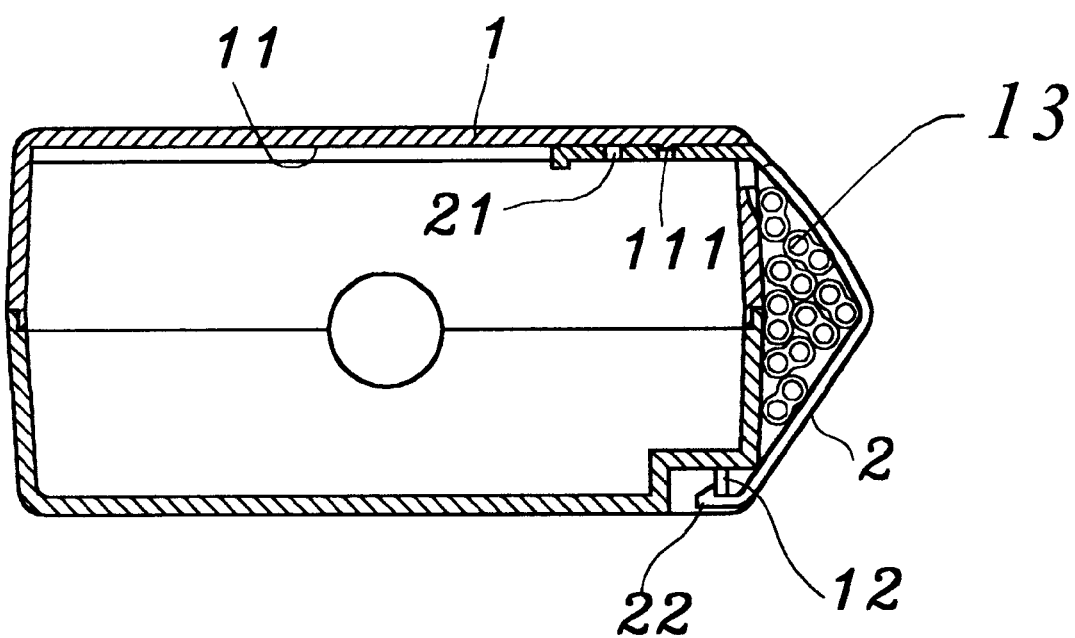
FIG. 5 is an applied view of the present invention, showing the end hook of the power cable binder fastened to the bottom hook of the casing the power cable of the power supply device arranged together and secured to one vertical side wall of the casing.

Referring to FIG. 5, when the power supply device is not in use, the end hook 22 is pulled outwards from the transverse sliding track 11 and hooked on the bottom hook 22 and the rear end of the power cable binder 2 is secured to the raised portion 111 in the transverse sliding track 11, enabling the power cable 13 of the power supply device to be arranged together and secured to one vertical side wall of the casing 1 by the power cable binder 2.

While only one embodiment of the present invention has been shown and described, it will be understood that various modifications and changes could be made thereunto without departing from the spirit and scope of the invention disclosed.

What the invention claimed is:

1. A power cable binder mounting arrangement comprising:

a casing for a power supply device, said casing comprising a transverse sliding track transversely extended to one vertical side wall near a top side wall thereof, at least one raised portion respectively provided in said transverse sliding track, and a bottom hook raised from a bottom side wall thereof; and a power cable binder moved in and out of said transverse sliding track and fastened to said bottom hook at said casing for securing the power cable of the power supply device to one vertical side wall of said casing, said power cable binder having a rear end inserted into said transverse sliding track, a longitudinal series of positioning holes for engagement with said at least one raised portions in said transverse sliding track, and an end hook at a front end thereof for hooking up with the bottom hook at said casing.

2. The power cable binder of claim 1 wherein said bottom hook of said casing is suspended in a recessed portion at the bottom side wall of said casing.

* * * * *